(12) United States Patent
Mashima

(10) Patent No.: US 6,361,176 B1
(45) Date of Patent: Mar. 26, 2002

(54) REFLECTION REDUCTION PROJECTION OPTICAL SYSTEM

(75) Inventor: Kiyoto Mashima, Kawasaki (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/612,384

(22) Filed: Jul. 7, 2000

(30) Foreign Application Priority Data

Jul. 9, 1999 (JP) .......................................... 11-196322

(51) Int. Cl.[7] ................................................. G02B 5/08
(52) U.S. Cl. ....................... 359/857; 359/858; 359/859; 359/861; 359/862
(58) Field of Search ................................. 359/857, 856, 359/861–862, 858, 859, 713, 730, 731; 378/34

(56) References Cited

U.S. PATENT DOCUMENTS

| | | | |
|---|---|---|---|
| 5,071,240 A | * 12/1991 | Ichihara et al. | ............. 359/366 |
| 5,686,728 A | 11/1997 | Shafer | ...................... 250/492.2 |
| 5,815,310 A | 9/1998 | Williamson | .................. 359/365 |
| 6,033,079 A | 3/2000 | Hudyma | ...................... 359/857 |

* cited by examiner

Primary Examiner—Mohammad Sikder

(57) ABSTRACT

A reflection reduction projection optical system having large numerical aperture for use in X-ray lithography. The reflection reduction projection optical system includes at least five aspheric surface reflecting mirrors and a reflecting mirror having a predetermined configuration, causing reduction imaging on an imaging surface I by imaging a light beam from an object O only one time. The reflection reduction projection optical system includes, in light path sequence from the object, a first convex mirror, a first concave mirror, the mirror having a predetermined configuration, a second concave mirror, a second convex mirror, and a third concave mirror. The reflection reduction projection optical system also includes an aperture stop located on the second convex mirror.

10 Claims, 5 Drawing Sheets

REFLECTION REDUCTION PROJECTION OPTICAL SYSTEM

CROSS-REFERENCE TO RELATED APPLICATIONS

This application is based upon and claims priority of Japanese Patent Application No. 11-196322, filed Jul. 9, 1999, the contents being incorporated herein by reference.

BACKGROUND OF THE INVENTION

1. Field of the Invention

The present invention relates to a reflection reduction projection optical system. More particularly, the present invention relates to a reflection reduction projection optical system for use in X-ray lithography.

2. Description of the Related Art

Reflection reduction projection optical systems for use in X-ray lithography are known. For example, Japanese Laid-Open Patent Publication JP-A-Hei 5-36588 discloses a reflection reduction projection optical system using four (4) aspheric surface reflecting mirrors. However, the optical system disclosed in JP-A-Hei 5-36586 suffers from the problem that the numerical aperture ("NA") can not be made large.

SUMMARY OF THE INVENTION

It is an object of the present invention to solve the problems of the known reflection reduction projection optical system, and to provide a reflection reduction projection optical system having a large numerical aperture for use in X-ray lithography.

Objects and advantages of the present invention are achieved in accordance with embodiments of the present invention with a reflection reduction projection optical system comprising at least five (5) aspheric surface reflecting mirrors and a reflecting mirror having a predetermined configuration, wherein the at least five aspheric surface reflecting mirrors and the reflecting mirror having a predetermined configuration perform reduction imaging on an imaging surface by imaging a light beam from an object only one time.

In accordance with embodiments of the present invention, the reflection reduction projection optical system preferably comprises, in light path sequence from the object side, a first convex mirror, a first concave mirror, the mirror having a predetermined configuration, a second concave mirror, a second convex mirror, and a third concave mirror.

In accordance with embodiments of the present invention, the reflection reduction projection optical system preferably satisfies the following condition (1):

$$-0.005 < p1+p2+p3+p4+p5+p6 < 0.005,$$

wherein p1 is the inverse of the focal distance of the first convex mirror, p2 is the focal distance of the first concave mirror, p3 is the inverse of the focal distance of the reflecting mirror having the predetermined configuration, p4 is the focal distance of the second concave mirror, p5 is the inverse of the focal distance of the second convex mirror, and p6 is the focal distance of the third concave mirror.

Objects and advantages of the present invention are achieved in accordance with embodiments of the present invention with a reflection reduction projection optical system comprising a plurality of reflecting mirrors which image a light beam from an object on an imaging plane, the plurality of reflecting mirrors including three reflecting mirrors arranged in an upstream direction from the imaging plane in a light path, wherein the three reflecting mirrors satisfy the following condition (2):

$$0° \leq U_{max} - U_{min} \leq 8.8°,$$

where $U_{max}$ is an angle of incidence of a light ray which is incident on the reflecting mirror at the largest angle of incidence, and $U_{min}$ is an angle of incidence of a light ray which is incident on the reflecting mirror at the smallest angle of incidence.

Objects and advantages of the present invention are achieved in accordance with embodiments of the present invention with a reflection projection optical system comprising only reflecting mirrors which respectively satisfy the condition (2):

$$0° \leq U_{max} - U_{min} \leq 8.8°,$$

wherein $U_{max}$ is the angle of incidence of a light ray which is incident on the reflecting mirror at the largest angle of incidence, and $U_{min}$ is an angle of incidence of a light ray which is incident on the reflecting mirror at the smallest angle of incidence.

In accordance with embodiments of the present invention, the reflecting projection optical system preferably includes at least five (5) aspheric surface reflecting mirrors and a reflecting mirror having a predetermined configuration.

In accordance with embodiments of the present invention, a reflecting reduction projection optical system is provided which has a large NA for use in X-ray lithography.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENTS

Figure 1:
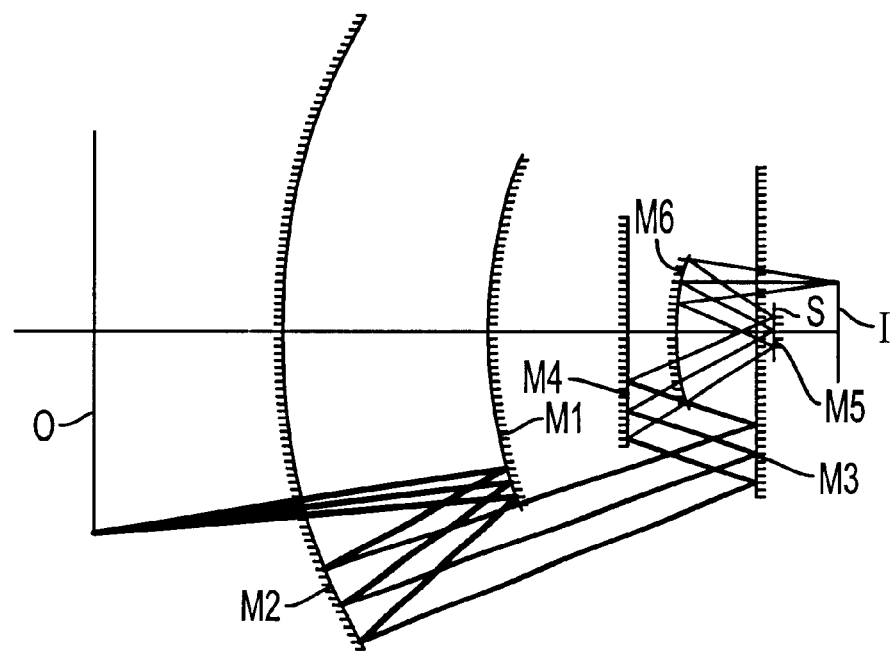
FIG. 1 is a diagram of an optical system in accordance with a first embodiment of the present invention.

Reference will now be made in detail to the preferred embodiments of the present invention, examples of which are illustrated in the accompanying drawings, wherein like reference numerals refer to like elements throughout.

Figure 2:
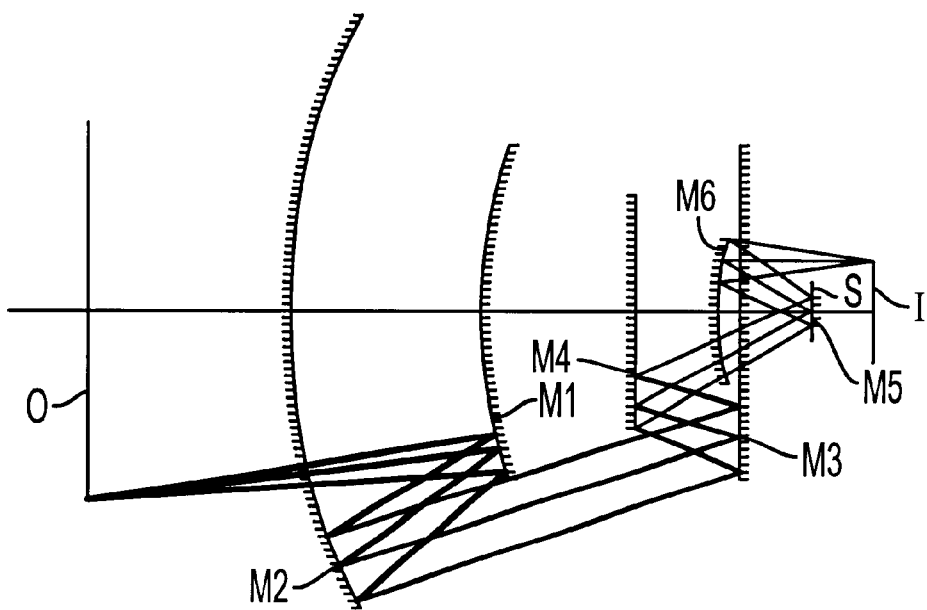
FIG. 2 is a diagram of an optical system in accordance with a second embodiment of the present invention.
Figure 3:
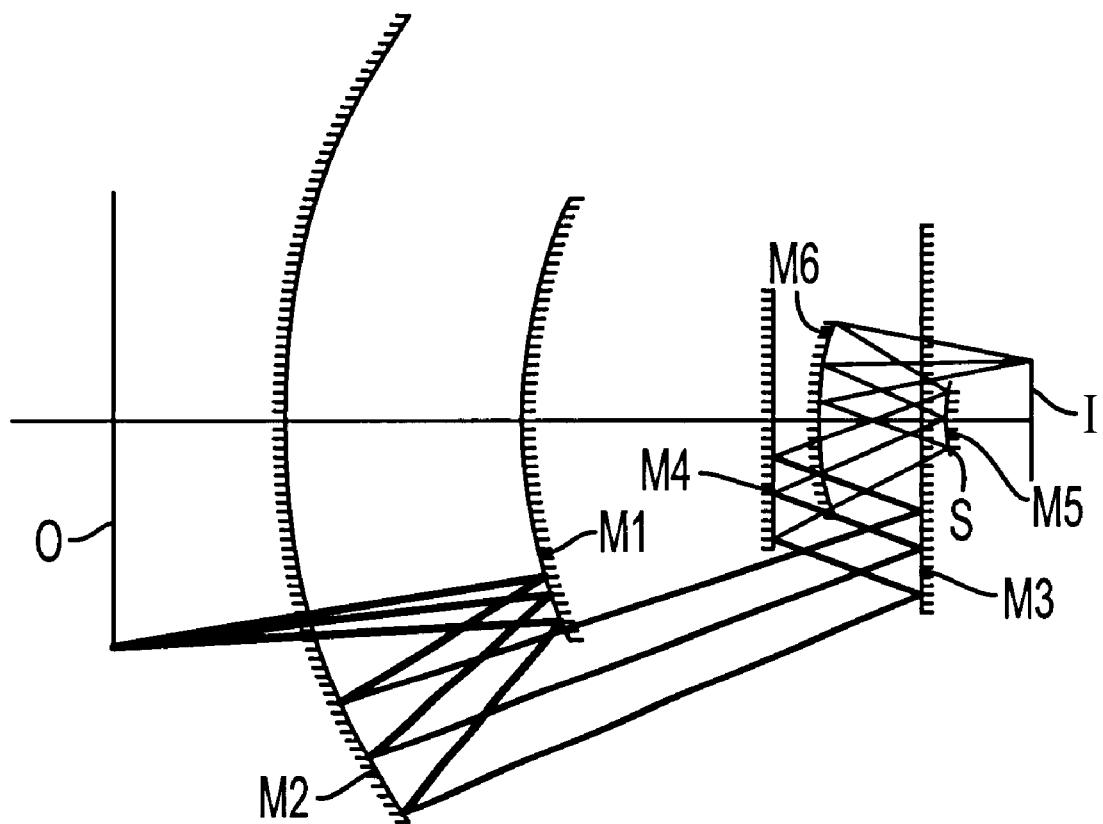
FIG. 3 is a diagram of an optical system in accordance with a third embodiment of the present invention.

As shown in FIGS. 1–3, in accordance with preferred embodiments of the present invention, the reflection reduction projection optical system comprises six (6) reflecting mirrors M1–M6. By providing a reflection reduction optical system with six reflecting mirrors, design freedom is increased, and, as a result, it is possible to make the NA large without increasing aberration. Moreover, because the reflection reduction projection optical system includes six (6)

reflecting mirrors, an object O and an image plane I can be located at opposite sides of the optical system, and mechanical interference between the object O and image plane I can be avoided. Furthermore, by performing imaging one time only (that is, without forming intermediate images), the overall length of the optical system can be made small. In accordance with embodiments of the present invention, in order to make manufacturing and adjustment easy, a reflecting mirror is preferably a plane mirror.

As shown in FIGS. 1–3, in order to obtain optimum performance, the reflection reduction optical system may comprise, in light path sequence from the object O side, a first convex mirror M1, a first concave mirror M2, a mirror M3 having a predetermined configuration, a second concave mirror M4, a second convex mirror M5, and a third concave mirror M6. In accordance with embodiments of the present invention, the predetermined configuration of the mirror M3 may be a plane surface or a concave surface having a very large radius of curvature. For example, the mirror M3 in the embodiment shown in FIG. 2 preferably has a planar configuration, while the mirror M3 in the embodiments shown in FIGS. 1 and 3 preferably has a concave surface with a large radius of curvature. However, the predetermined configuration may also be a convex surface having a very large radius of curvature.

In accordance with embodiments of the present invention, by arranging an aperture stop S on the second convex mirror M5, mechanical interference between the aperture stop S and a light source is avoided. Further, by making the reflection reduction projection optical system telecentric on the image plane I side, even if a wafer, or the like, located on the image plane I moves more or less in the optical axis direction, the size of the image can remain unchanged. That is, even if the focal position is displaced the size of the image remains unchanged.

In accordance with embodiments of the present invention, the reflection reduction projection optical system preferably satisfies the following condition (1):

$$-0.005 < p1+p2+p3+p4+p5+p6 < 0.005,$$

wherein p1 is the inverse of the focal distance of the first convex mirror, p2 is the focal distance of the first concave mirror, p3 is the inverse of the focal distance of the reflecting mirror having the predetermined configuration, p4 is the focal distance of the second concave mirror, p5 is the inverse of the focal distance of the second convex mirror, and p6 is the focal distance of the third concave mirror.

Condition (1) is a condition to obtain a flat imaging surface. By bringing the value of condition (1) close to zero (0) (i.e., p1+p2+p3+p4+p5+p6≅0), an enlargement of the fine image region width can be achieved, and can be used for a good image. When the range of condition (1) is exceeded, a flat image plane is not obtained.

The three reflecting mirrors arranged in an upstream direction from the imaging plane in the light path from the object, satisfy the following condition:

$$0° \leq U_{max} - U_{min} \leq 8.8°,$$

where $U_{max}$ is an angle of incidence of a light ray which is incident on the reflecting mirror at the largest angle of incidence, and $U_{min}$ is an angle of incidence of a light ray which is incident on the reflecting mirror at the smallest angle of incidence.

In accordance with embodiments of the present invention, condition (2) is a condition of the reflecting mirrors M1–M6 which is to be satisfied in order for no phase shift to arise in the light reflected from the reflecting mirrors M1–M6. If the angle of incidence of an incident light ray is equal in all positions of one reflecting mirror, phase shift does not arise because the phase of the reflected light becomes the same in all positions of the reflecting mirror. The angle of incidence of an incident light ray being equal in all positions is the lower limit value of condition (2), i.e., when $U_{max} - U_{min} = 0$. In practice, because of design requirements or tolerance range of a thin film, the angle of incidence of an incident light ray in all positions of one reflecting mirror may vary a little. The tolerance range of the variation of the angle of incidence is the value of $U_{max} - U_{min}$. The tolerance range is preferably less than or equal to 8.8°. If the tolerance range of the variation of the angle of incidence is exceeded, the phase shift becomes pronounced, and the image is corrupted. When the tolerance range is severely exceeded, the whole image is affected, and the phenomenon of a shift of the position of the image occurs.

Furthermore, better results are obtained by setting the upper limit of condition (2) to 7.5°, and good results are obtained when the upper limit of condition (2) is set to 6°.

Moreover, in accordance a preferred embodiment of the present invention, it is preferable for condition (2) to be satisfied, as far as possible, by all the reflecting mirrors M1–M6.

However, in accordance with another preferred embodiment of the invention, it is preferable for condition (2) to be satisfied by the reflecting mirror which is positioned toward the image plane I. More specifically, it is preferable for condition (2) to be satisfied by the reflecting mirror toward the imaging plane I because, for the same variation of the angle of incidence, the closer the reflecting mirror is positioned to the imaging plane I, the greater the influence on the corruption of the image in comparison to reflecting mirrors which are located toward the object. In accordance with embodiments of the present invention, it is desirable for up to the three reflecting mirrors upstream on the light path from the imaging plane to satisfy condition (2). In accordance with embodiments of the present invention, "up to the three reflecting mirrors upstream on the light path from the image plane I" indicates, in the light path sequence, the reflecting mirror third nearest to the imaging plane I, the reflecting mirror second nearest to the imaging plane I, and the reflecting mirror closest to the imaging plane I.

Operational examples of preferred embodiments of the present invention will now be described hereinbelow. Each of the respective embodiments described below comprises the first convex mirror M1, the first concave mirror M2, the mirror M3 having a predetermined configuration, the second concave mirror M4, the second convex mirror M5, and the third concave mirror M6. An aperture stop S is arranged on the second convex mirror M5. Moreover, in the examples described below, the magnification is ¼ times, and uses an image height Y=30–31 circular arc region as an exposure region. The aspheric form is represented by Z(y), where $$Z(y) = y^2/r[1+\{1-(1+\kappa)y^2/r^2\}^{1/2}] + Ay^4 + By^6 + Cy^8 + Dy^{10}$$

In the equation above, r is the vertex radius of curvature, y is the distance from the optical axis, κ is the cone constant, and A, B, C and D are aspheric surface constants.

Moreover, in accordance with embodiments of the present invention, the reflection reduction projection optical system uses a wavelength of 13 nm, a reticle as the object, and a wafer on the image plane I. Furthermore, the mirror surfaces are preferably formed by Mo/Si multilayer films or Mo/SiC multilayer films.

Figure 4:
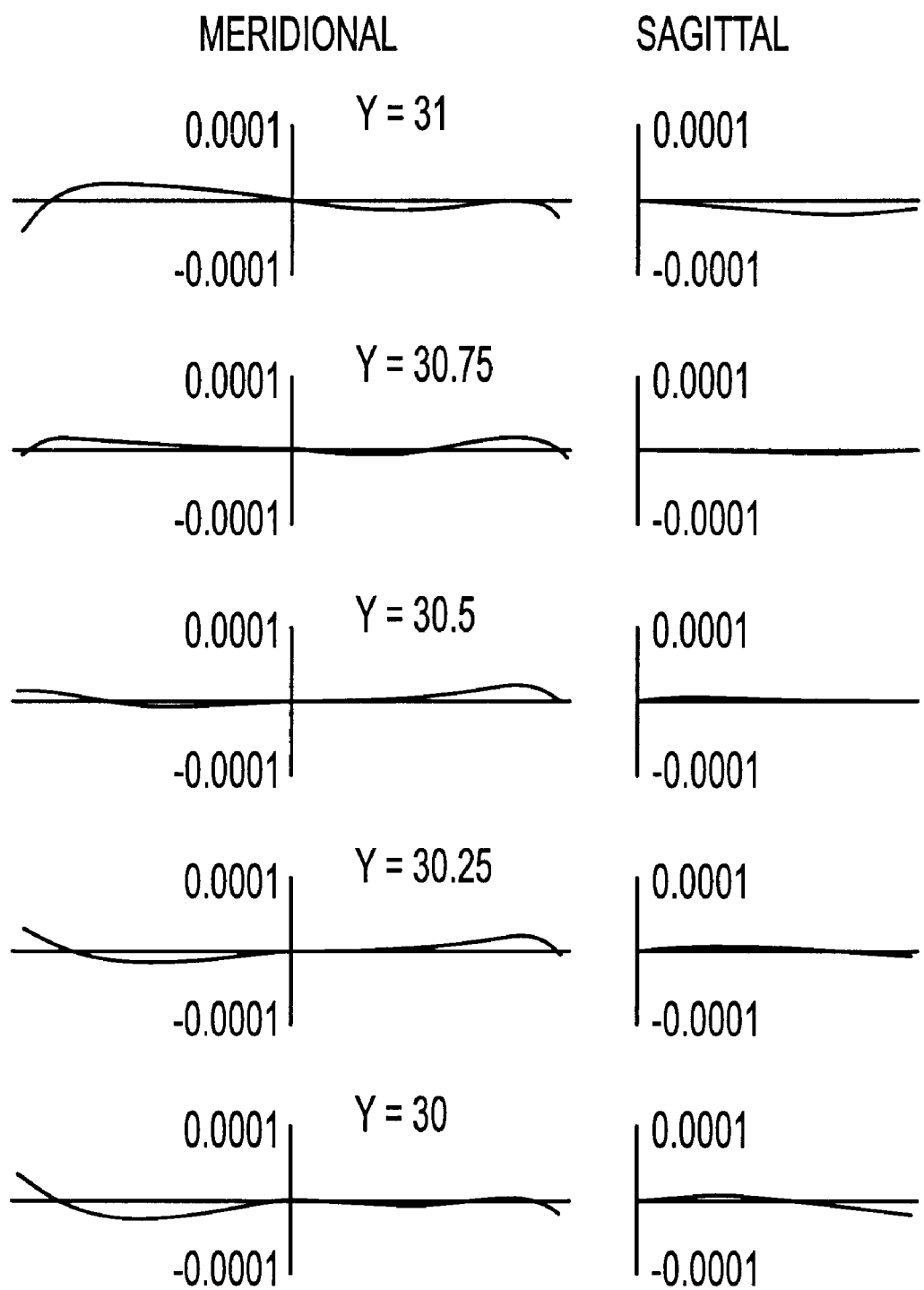
FIG. 4 is an aberration diagram for the first embodiment of the present invention.
Figure 5:
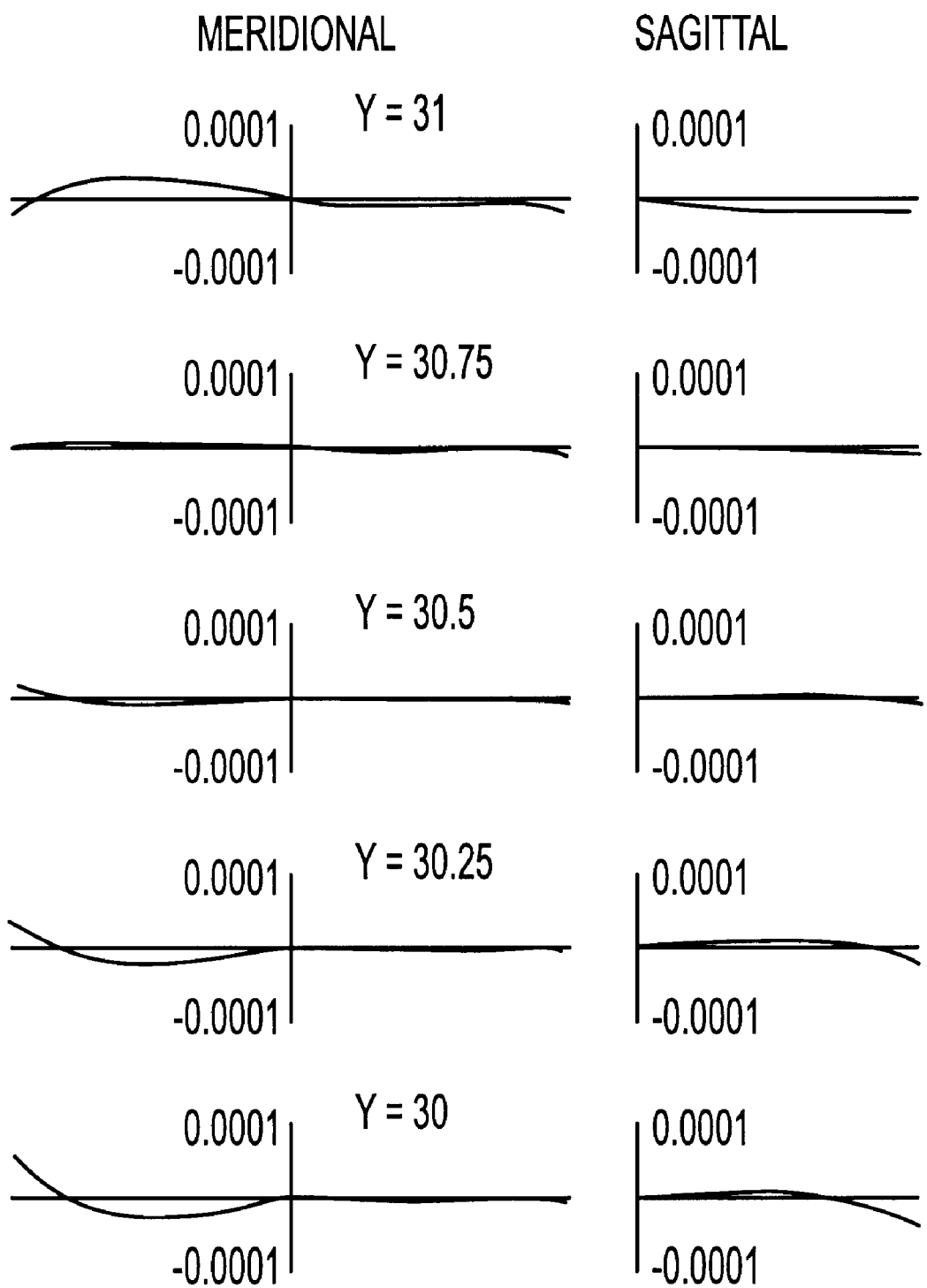
FIG. 5 is an aberration diagram for the second embodiment of the present invention.
Figure 6:
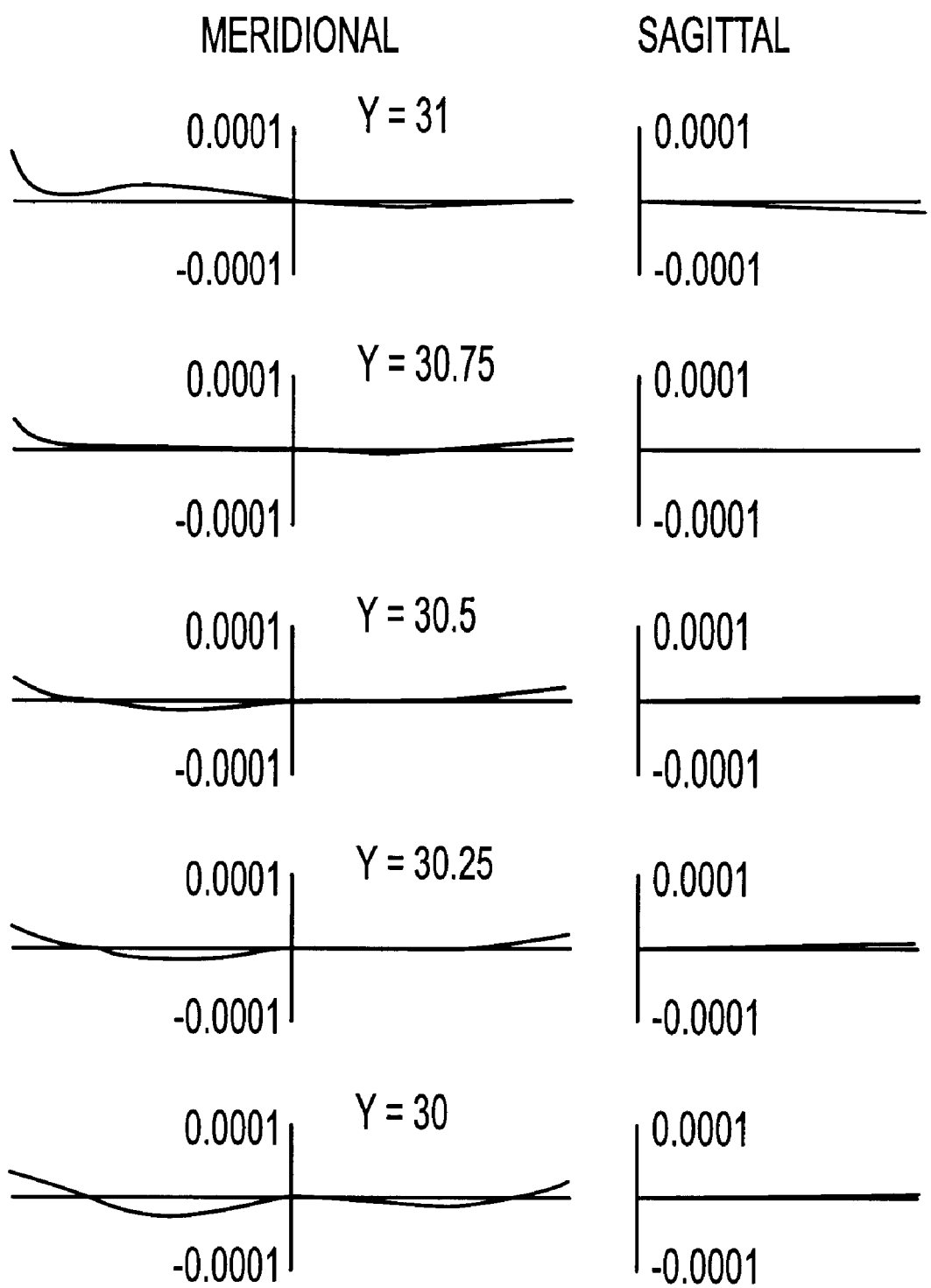
FIG. 6 is an aberration diagram for the third embodiment of the present invention.

In Tables 1–3 below for the respective examples, r represents a radius of curvature, d represents a surface spacing, and Y in the aberration diagrams shown in FIGS. 4–6 represents the image height.

EXAMPLE 1

Table 1 below lists the radius of curvature r, surface spacing d, cone constant κ, and aspheric surface constants A, B, C, D for the embodiment of the invention shown in FIG. 1. FIG. 4 illustrates an aberration diagram for the embodiment shown in FIG. 1.

Moreover, in Example 1, the imaging plane side NA=0.14; the spacing on optical axis, reticle plane–first surface=247.311; the spacing on optical axis, last surface–wafer surface=100.977; and $$p1+p2+p3+p4+p5+p6=0.000144$$

TABLE 1

| Surface No. | r | d | |
|---|---|---|---|
| 1 | 259.702 | −131.142 | M1 |
| 2 | 373.476 | 299.090 | M2 |
| 3 | −9419.368 | −82.804 | M3 |
| 4 | 629.595 | 93.183 | M4 |
| 5 | 120.356 | −61.356 | M5 S |
| 6 | 127.238 | | M6 |

| κ | A | B | C | D |
|---|---|---|---|---|
| −1.658 | $0.765*10^{-8}$ | $0.208*10^{-13}$ | $0.108*10^{-17}$ | $0.270*10^{-21}$ |
| 0.058 | $-0.162*10^{-9}$ | $0.138*10^{-14}$ | $-0.374*10^{-19}$ | $0.151*10^{-23}$ |
| −7716.247 | $0.763*10^{-9}$ | $-0.322*10^{-13}$ | $0.405*10^{-17}$ | $-0.750*10^{-22}$ |
| −5.725 | $-0.523*10^{-8}$ | $-0.186*10^{-12}$ | $0.166*10^{-16}$ | $-0.991*10^{-21}$ |
| 0.176 | $0.363*10^{-7}$ | $0.854*10^{-11}$ | $0.234*10^{-13}$ | $-0.128*10^{-15}$ |
| 0.081 | $0.891*10^{-8}$ | $0.899*10^{-12}$ | $0.255*10^{-16}$ | $0.126*10^{-19}$ |

EXAMPLE 2

Table 2 shows the radius of curvature r, the surface spacing d, the cone constant κ, and the aspheric surface constants A, B, C and D for the embodiment of the invention shown in FIG. 2. FIG. 5 illustrates the aberration for the embodiment shown in FIG. 2.

In Example 2, the image plane side NA=0.14; the spacing on optical axis, reticle plane–first surface=264.523; the spacing on optical axis, last surface–wafer surface=103.953; and $$p1+p2+p3+p4+p5+p6=0.000155$$

TABLE 2

| Surface No. | r | d | | |
|---|---|---|---|---|
| 1 | 266.530 | −130.616 | M1 | |
| 2 | 387.461 | 306.752 | M2 | |
| 3 | ∞ | −74.623 | M3 | |
| 4 | 648.429 | 121.654 | M4 | |
| 5 | 126.168 | −63.334 | M5 | S |
| 6 | 131.026 | | M6 | |

| Surface No. | κ | A | B | C | D |
|---|---|---|---|---|---|
| 1 | −1.891 | $0.836*10^{-8}$ | $0.136*10^{12}$ | $-0.764*10^{18}$ | $0.199*10^{-21}$ |

TABLE 2-continued

| 2 | 0.006 | $-0.142*10^{-9}$ | $0.484*10^{-14}$ | $-0.196*10^{-19}$ | $0.927*10^{-24}$ |
| 3 | | 0.0 | 0.0 | 0.0 | 0.0 |
| 4 | −4.335 | $-0.459*10^{-8}$ | $-0.502*10^{-13}$ | $-0.241*10^{-17}$ | $0.653*10^{-23}$ |
| 5 | 0.096 | $0.391*10^{-7}$ | $0.783*10^{-11}$ | $-0.284*10^{-14}$ | $0.226*10^{-16}$ |
| 6 | 0.054 | $0.970*10^{-8}$ | $0.873*10^{-12}$ | $0.278*10^{-16}$ | $0.951*10^{-20}$ |

EXAMPLE 3

Table 3 shows the radius of curvature r, the surface spacing d, the cone constant κ, and the aspheric surface constants A, B, C and D for the embodiment shown in FIG. 3. FIG. 6 illustrates the aberration for the embodiment shown in FIG. 3.

In Example 3, the image plane side NA=0.20; the spacing on optical axis, reticle plane–first surface=230.466; the spacing on optical axis, last surface–wafer surface=118.573; and $$p1+p2+p3+p4+p5+p6=-0.000003.$$

TABLE 3

| Surface No. | r | d | | |
|---|---|---|---|---|
| 1 | 240.277 | −133.431 | M1 | |
| 2 | 369.640 | 358.156 | M2 | |
| 3 | −13255.008 | −84.394 | M3 | |
| 4 | 1070.550 | 96.654 | M4 | |
| 5 | 155.741 | −70.913 | M5 | S |
| 6 | 145.638 | | M6 | |

| Surface No. | κ | A | B | C | D |
|---|---|---|---|---|---|
| 1 | −1.448 | $0.781*10^{-8}$ | $0.435-10^{-13}$ | $0.131-10^{-17}$ | $0.583*10^{-22}$ |
| 2 | 0.049 | $-0.251*10^{-9}$ | $0.816-10^{-15}$ | $-0.260*10^{-19}$ | $0.348*10^{-24}$ |
| 3 | 8612.925 | $0.292*10^{-8}$ | $-0.257*10^{-13}$ | $0.203*10^{-17}$ | $0.130*10^{-23}$ |
| 4 | −6.705 | $-0.736*10^{-8}$ | $-0.233*10^{-12}$ | $0.128*10^{-16}$ | $-0.117*10^{-20}$ |
| 5 | −1.781 | $0.995*10^{-7}$ | $0.510*10^{-11}$ | $0.605*10^{-15}$ | $-0.951*10^{-19}$ |
| 6 | 0.129 | $0.434*10^{-8}$ | $0.341*10^{-12}$ | $0.149*10^{-16}$ | $0.228*10^{-20}$ |

The corresponding values of condition (2) for each of the Examples 1–3 are shown in the tables below.

Example 1

| | Example 1 | | |
|---|---|---|---|
| Surface No. | $U_{max}$ | $U_{min}$ | $U_{max} - U_{min}$ |
| 1 | 18.15 | 9.67 | 8.48 |
| 2 | 10.01 | 5.13 | 4.92 |
| 3 | 20.95 | 17.67 | 3.28 |
| 4 | 26.63 | 20.77 | 5.86 |
| 5 | 28.83 | 26.74 | 2.09 |
| 6 | 15.64 | 12.11 | 3.53 |

Example 2

| Example 2 | | | |
|---|---|---|---|
| Surface No. | $U_{max}$ | $U_{min}$ | $U_{max} - U_{min}$ |
| 1 | 18.27 | 9.49 | 8.78 |
| 2 | 11.04 | 5.64 | 5.40 |
| 3 | 18.64 | 15.67 | 2.96 |
| 4 | 24.90 | 19.23 | 5.67 |
| 5 | 27.94 | 25.98 | 1.96 |
| 6 | 15.28 | 11.64 | 3.65 |

Example 3

| Example 3 | | | |
|---|---|---|---|
| Surface No. | $U_{max}$ | $U_{min}$ | $U_{max} - U_{min}$ |
| 4 | 24.97 | 19.15 | 5.83 |
| 5 | 26.50 | 21.60 | 4.90 |
| 6 | 14.18 | 9.84 | 4.34 |

In accordance with embodiments of the present invention as described hereinabove, it is possible to provide a reflecting reduction projection optical system, having a large NA, for use in X-ray lithography.

Although preferred embodiments of the present invention have been shown and described, it will be appreciated by those skilled in the art that changes may be made in these embodiments without departing from the principle and spirit of the invention, the scope of which is defined in the appended claims and their equivalents.

What is claimed is:

1. A reflection reduction projection optical system, comprising:
   at least five aspheric surface reflecting mirrors; and
   a reflecting mirror having a predetermined configuration;
   wherein the at least five aspheric surface reflecting mirrors and the reflecting mirror having a predetermined configuration perform reduction imaging on an imaging surface by imaging a light beam from an object only one time.

2. A reflection reduction projection optical system as recited in claim 1, wherein the reflecting reduction projection optical system comprises, in light path sequence from the object, a first convex mirror, a first concave mirror, the mirror having a predetermined configuration, a second concave mirror, a second convex mirror, and a third concave mirror.

3. A reflection reduction projection optical system as recited in claim 2, further comprising an aperture stop located on the second convex mirror.

4. A reflection reduction projection optical system as recited in claim 1, wherein the reflection reduction projection optical system is a telecentric optical system on the imaging surface side.

5. A reflection reduction projection optical system as recited in claim 2, wherein the five aspheric mirrors and the reflecting mirror having a predetermined configuration satisfy a condition $-0.005 <$ $$p1+p2+p3+p4+p5+p6 < 0.005,$$

wherein p1 is the inverse of the focal distance of the first convex mirror, p2 is the focal distance of the first concave mirror, p3 is the inverse of the focal distance of the reflecting mirror having a predetermined configuration, p4 is the focal distance of the second concave mirror, p5 is the inverse of the focal distance of the second convex mirror, and p6 is the focal distance of the third concave mirror.

6. A reflecting projection optical system, comprising:
   at least five aspheric surface reflecting mirrors; and
   a plurality of reflecting mirrors to image a light beam from an object on an imaging plane;
   the plurality of reflecting mirrors including three reflecting mirrors arranged in an upstream direction from the imaging plane in a light path;
   wherein the at least five aspheric surface reflecting mirrors and one or more of the reflecting mirrors having a predetermined configuration perform reduction imaging on an imaging surface by imaging a light beam from an object only one time;
   wherein the three reflecting mirrors satisfy the condition $$0° \leq U_{max} - U_{min} \leq 8.8°,$$

and
   wherein $U_{max}$ is an angle of incidence of a light ray incident on a reflecting mirror at a largest angle of incidence, and $U_{min}$ is an angle of incidence of a light ray incident on the reflecting mirror at a smallest angle of incidence.

7. A reflection projection optical system as recited in claim 6, wherein the reflection projection optical system includes at least five aspheric surface reflecting mirrors and a mirror having a predetermined configuration.

8. A reflecting projection optical system, comprising:
   at least five aspheric surface reflecting mirrors; and
   one or more reflecting mirrors having a predetermined configuration;
   wherein the at least five aspheric surface reflecting mirrors and the one or more reflecting mirrors having a predetermined configuration perform reduction imaging on an imaging surface by imaging a light beam from an object only one time; and
   wherein the reflecting mirrors satisfy the condition $$0° \leq U_{max} - U_{min} \leq 8.8°,$$

wherein $U_{max}$ is an angle of incidence of a light ray which is incident on the reflecting mirror at a largest angle of incidence, $U_{min}$ is an angle of incidence of a light ray which is incident on the reflecting mirror at a smallest angle of incidence.

9. A reflection projection optical system as recited in claim 8, wherein the one or more reflecting mirrors having a predetermined configuration is a mirror having a predetermined configuration.

10. A reflection projection optical system as recited in claim 6, wherein the optical system includes three reflecting mirrors.

* * * * *

UNITED STATES PATENT AND TRADEMARK OFFICE
CERTIFICATE OF CORRECTION

PATENT NO. : 6,361,176 B1
DATED : March 26, 2002
INVENTOR(S) : Kiyoto Mashima

It is certified that error appears in the above-identified patent and that said Letters Patent is hereby corrected as shown below:

<u>Column 7, line 61- Column 8, line 9,</u>
Replace claim 5 with,
-- 5. A reflection reduction projection optical system as recited in claim 2, wherein the five aspheric mirrors and the reflecting mirror having a predetermined configuration satisfy a condition $-0.005 < p1 + p2 + p3 + p4 + p5 + p6 < 0.005$,
   wherein p1 is the inverse of the focal distance of the first convex mirror, p2 is the focal distance of the first concave mirror, p3 is the inverse of the focal distance of the reflecting mirror having a predetermined configuration, p4 is the focal distance of the second concave mirror, p5 is the inverse of the focal distance of the second convex mirror, and p6 is the focal distance of the third concave mirror. --

Signed and Sealed this

Twenty-second Day of October, 2002

*Attest:*

*Attesting Officer*

JAMES E. ROGAN
*Director of the United States Patent and Trademark Office*